United States Patent [19]

Cushman et al.

[11] Patent Number: 4,523,972
[45] Date of Patent: Jun. 18, 1985

[54] METHOD OF AND APPARATUS FOR HANDLING CRYSTAL INGOTS

[75] Inventors: Robert H. Cushman, Princeton, N.J.; Charles E. Stout, Jr., Emmaus, Pa.

[73] Assignee: AT&T Technologies, Inc., New York, N.Y.

[21] Appl. No.: 555,781

[22] Filed: Nov. 28, 1983

[51] Int. Cl.³ ............................................. C30B 15/02
[52] U.S. Cl. ..................... 156/617 SP; 156/DIG. 98; 422/249; 269/17; 269/35; 269/287; 414/225; 414/731; 414/785; 414/911; 294/68.1; 294/67.4
[58] Field of Search ......... 156/617 SP, 620, DIG. 98; 422/248, 249; 269/17, 35, 287; 414/222, 225, 731, 785, 911; 294/670 B, 67 E, 74; 65/187, 188

[56] References Cited

U.S. PATENT DOCUMENTS

| | | | |
|---|---|---|---|
| 2,827,189 | 3/1958 | Knudstrup | 414/785 |
| 2,975,036 | 3/1961 | Taylor et al. | 156/617 SP |
| 3,064,840 | 11/1962 | Ilon | 414/731 |
| 3,768,954 | 10/1973 | Marsh et al. | 414/785 |
| 3,938,685 | 2/1976 | Walchek | 414/785 |
| 4,212,577 | 7/1980 | Swanson | 414/731 |
| 4,345,866 | 8/1982 | Greene | 414/224 |
| 4,350,560 | 9/1982 | Helgeland et al. | 156/617 SP |

FOREIGN PATENT DOCUMENTS

2479276 10/1981 France ..................... 156/617 SP

Primary Examiner—David L. Lacey
Attorney, Agent, or Firm—W. O. Schellin; G. W. Houseweart

[57] ABSTRACT

A semiconductor crystal ingot (14) is supportively engaged by an ingot handling apparatus (22) which contacts a base (38) of the ingot (14) with a base support (36) and opposite sides of a lateral surface of the ingot (14) with at least one pair of jaws (37). The jaws (37) are retained adjacent to but out of firm contact with the lateral surface of the ingot until after the support (36) firmly supports the weight of the ingot. The support and the at least one pair of jaws are retracted from a furnace (10) simultaneously in a lateral direction with no relative movement to withdraw the ingot from the furnace.

21 Claims, 9 Drawing Figures

METHOD OF AND APPARATUS FOR HANDLING CRYSTAL INGOTS

TECHNICAL FIELD

The present invention relates to methods of and apparatus for handling crystal ingots. The invention relates particularly to methods of and apparatus for removing grown crystal ingots from crystal growing furnaces.

BACKGROUND OF THE INVENTION

Cyrstal growing is a significant precursory activity in the manufacture of semiconductor devices. Semiconductor crystal growing processes have been improved to yield single-crystal semiconductor ingots which may range, for example, in excess of 125 mm in diameter and between one and two meters in length. Various commercially available models of crystal growing furnaces supportive of the commonly followed crystal growing processes are functionally and structurally similar. A typical crystal growing furnace features a crystal growing chamber in the base of the furnace. The crystal growing chamber typically houses a crucible, heating elements to melt down and maintain as a melt a charge of a crystalline material fed into the crucible, and mechanisms for rotating the crucible to control the uniformity of the heat flux in the melt during the crystal growing process.

Rising above the crystal growing chamber is a towering structure of a crystal pulling chamber. The crystal pulling chamber typically is an upright, substantially cylindrical enclosure terminating in an upper structure of a crystal pulling mechanism. The crystal growing chamber and the crystal pulling chamber are in communication with each other during the growing process. As a crystal ingot continues to grow from the melt in the growing chamber, the crystal pulling mechanism raises the ingot at at a rather constant rate into the crystal pulling chamber. Typically, an operator removes the grown crystal ingot from such described furnace through a side access door in the crystal pulling chamber. A port between the crystal growing chamber and the crystal pulling chamber may be closed while the normally hermetically sealed side access door of the pulling chamber remains open.

Removing crystal ingots from growing furnaces has in the past presented problems. Typically, the operator in removing a grown ingot, actually carries the ingot through the access door after disconnecting the neck of the ingot at the seed end from the crystal pulling mechanism. As technology progresses toward ever larger ingots, the weight of the grown ingot, as well as its residual elevated temperature at the time of its removal, make such manual removal a less than desirable operation.

U.S. Pat. No. 4,350,560 to Helgeland et al. discloses apparatus for and a method of handling crystals to remove them from growing furnaces by transferring a crystal ingot vertically downward to a transport mechanism. The disclosed apparatus and its related method avoid the problems typically associated with removing crystal ingots through the described side access doors. Unfortunately, the crystal handling method described in U.S. Pat. No. 4,350,560 also presupposes a furnace structure which has an accessibility below the crystal pulling chamber to accommodate the height of the transport mechanism as tall as the ingot is long. The crystal pulling mechanism and the crystal pulling chamber of the furnace as disclosed by the patent are simply movably mounted to become laterally offset from vertical alignment with the crystal growing chamber and into alignment with the transport mechanism. However, the solution provided by the above-mentioned patent does not apply to a large number of growing furnaces which are installed with insufficient space below such laterally moved crystal pulling chambers, or which have otherwise limited access to remove crystal ingots vertically from the crystal pulling chambers.

Furnace structures with such limited access are found particularly in installations of comparatively large structures of the latest commercially available high production furnaces. The crystal pulling chambers of such large furnaces typically extend through substantially the entire height of a factory level. In many instances, permanent, mezzanine-type, service platforms are built adjacent to upper portions of such furnaces to provide convenient access for servicing the pulling mechanisms of the furnaces. A vertical removal of crystal ingots from such large and often inaccessible furnace structures presents formidable problems. Consequently, the removal of ingots from most furnaces has up to now remained a manual task.

Problems encountered in attempting to remove crystal ingots by mechanical means from furnaces which have side access doors are related in part to the smoothness of the surface of the grown crystal ingots and to the brittleness of the crystalline material. Stresses are imparted to the crystal when the ingots are gripped too firmly to generate a sufficient friction force. An excessive contact force against the ingot coupled with a bending force tend to result in crystal fractures. If the ingots are gripped less firmly, they may slip and fall. Problems in gripping crystal ingots with mechanical grippers are further complicated by variations in length to which different crystal ingots are grown in successive operations of a growing furnace. Often the growing process is terminated before a crystal ingot has reached its maximum possible length. Consequently, crystal ingots of various lengths and weights need to be removed from the crystal growing furnaces.

SUMMARY OF THE INVENTION

The present invention provides advantageous apparatus for and methods of handling an ingot to effect its removal through a side access opening of a crystal growing furnace. In accordance with the invention, a cantilevered ingot support comprises an ingot base support which is suspended at an adjustable, determinable distance below at least one pair of laterally operable clamping jaws. In a preferred embodiment the base support opposes a vertical force component, namely the weight of the ingot, and the clamping jaws engage the sides of the ingot with a lateral force component sufficient to control the orientation of the ingot during its removal from the furnace.

A method of handling a crystal ingot grown in a crystal growing furnace comprises, in accordance with the invention, supporting the ingot hanging from a seed holder in a vertical chamber of the furnace by a support contacting the base of the ingot. The method further comprises engaging opposite sides of the lateral surface of the ingot by at least one set of laterally inwardly acting opposed jaws to support lateral forces acting on the ingot, and severing a supportive connection between the seed holder and the ingot, and laterally retracting the jaw and the support with the ingot from the furnace.

BRIEF DESCRIPTION OF THE DRAWING

Various features and advantages of the invention will be best understood when the following detailed description of the invention is read in reference to the appended drawing of which.

DETAILED DESCRIPTION

The Apparatus In General

Figure 1:
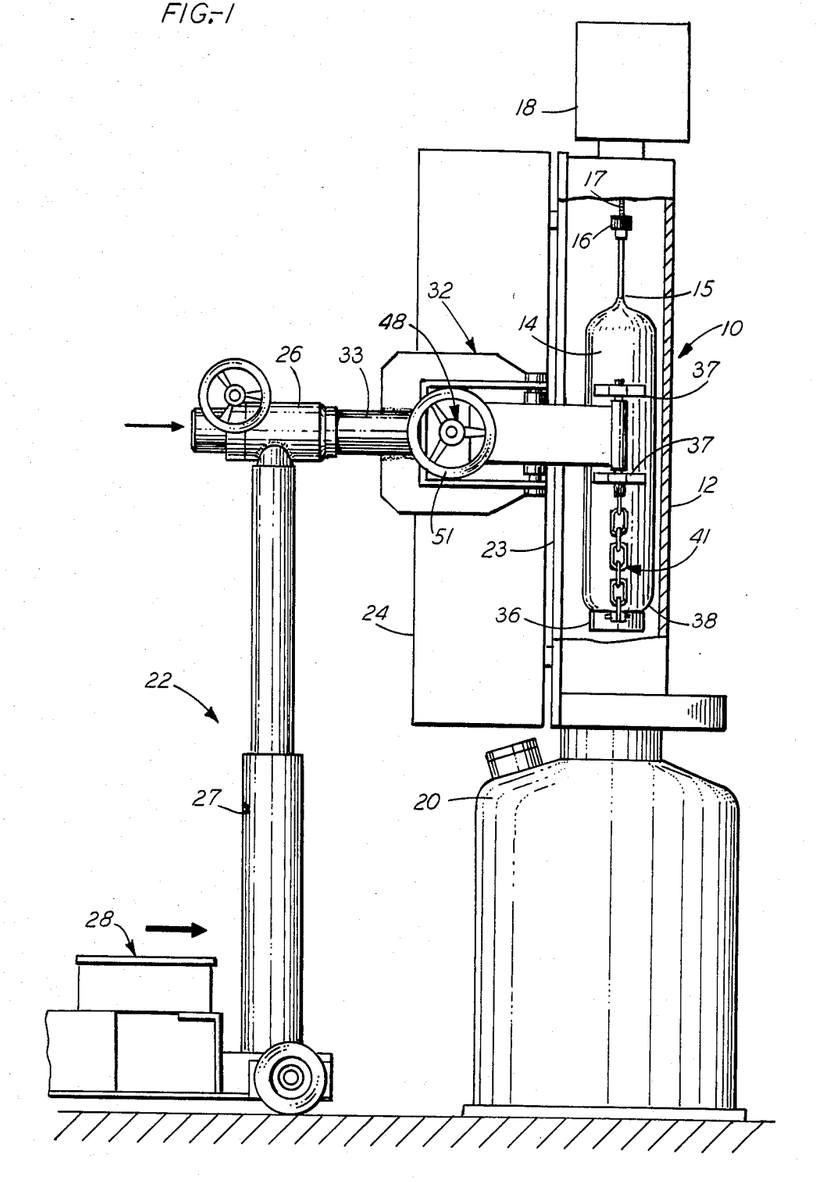
FIG. 1 shows features of the invention embodied in a crystal ingot handling apparatus shown adjacent to a crystal growing furnace and in engagement with a crystal ingot suspended in the furnace.

FIG. 1 shows a crystal growing furnace 10, and in particular, a crystal pulling chamber 12 of the furnace. An ingot 14 is suspended at its necked-down seed 15 from a seed holder 16 mounted to the lower end of a support cable 17. The support cable 17 and the seed holder 16 are part of a crystal pulling mechanism 18 which during the growing process controllably raises the ingot 14 from the melt located in a base 20 of the furnace 10 and which also rotates the ingot with respect to the melt.

An ingot handling apparatus, designated generally by the numeral 22, is shown substantially in position for removing the ingot 14 through a lateral opening 23 in the chamber 12. In preparation for removing the ingot 14, a lateral access door 24 has been opened. The handling apparatus 22 has been moved into position with respect to the ingot 14 as shown in FIG. 1.

In support of such movement, a positioning head 26 is vertically movable along and horizontally rotatable with respect to a vertical guide column 27. The guide column 27 is itself mounted for lateral movement with respect to the furnace 10. For example, in one embodiment of the invention, the guide column 27 is mounted to, and is part of, a wheeled vehicle 28 of a type which is typically used to transfer articles in factories and warehouses. Thus, the guide column 27 itself is mounted for translational movement as well as rotational movement about a vertical axis. The positioning head 26 supports and controls a horizontally extensible movement of a gripper-support assembly 32. The gripper-support assembly 32 is mounted to the free end of a horizontally extensible cantilever beam 33 which extends from the positioning head 26. The gripper-support assembly 32 after being positioned as shown in FIG. 1 is capable of supporting the weight of the ingot 14 in the vertical direction through contact of the ingot with a preferably cup-shaped support surface of a base support 36. The base support is suspended from a lower pair of two vertically spaced pairs of gripper jaws 37, inwardly directed guide surfaces of which engage the ingot 14 laterally and steady it above the base support 36.

The vertical guide column 27 is manipulated with respect to the furnace 10 to position the gripper-support assembly 32 adjacent to the ingot 14. The cantilever beam 33 is then extended from the positioning head 26 to position the base support 36 just below and substantially centered on a base 38 of the ingot 14. A sequence of steps of grasping the ingot 14 with the gripper-support assembly with little risk of damaging the ingot is best explained in reference to the schematic representations of the gripper-support assembly in FIGS. 2 through 4.

Removing The Ingot

Figure 2:
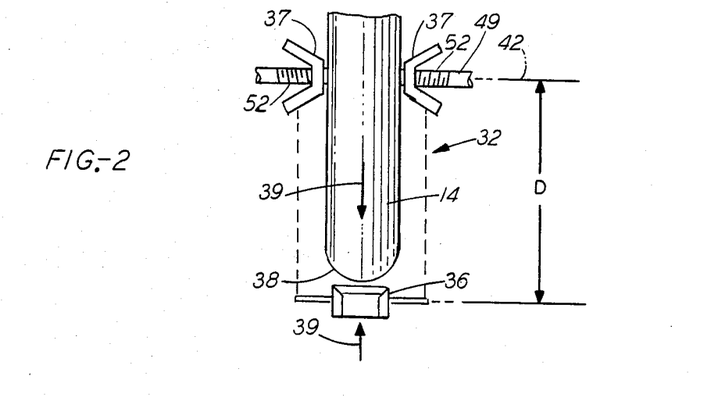
FIGS. 2 through 4 show schematically a sequence during which a gripper-support assembly of the handling apparatus of FIG. 1 engages a crystal ingot.
Figure 6:
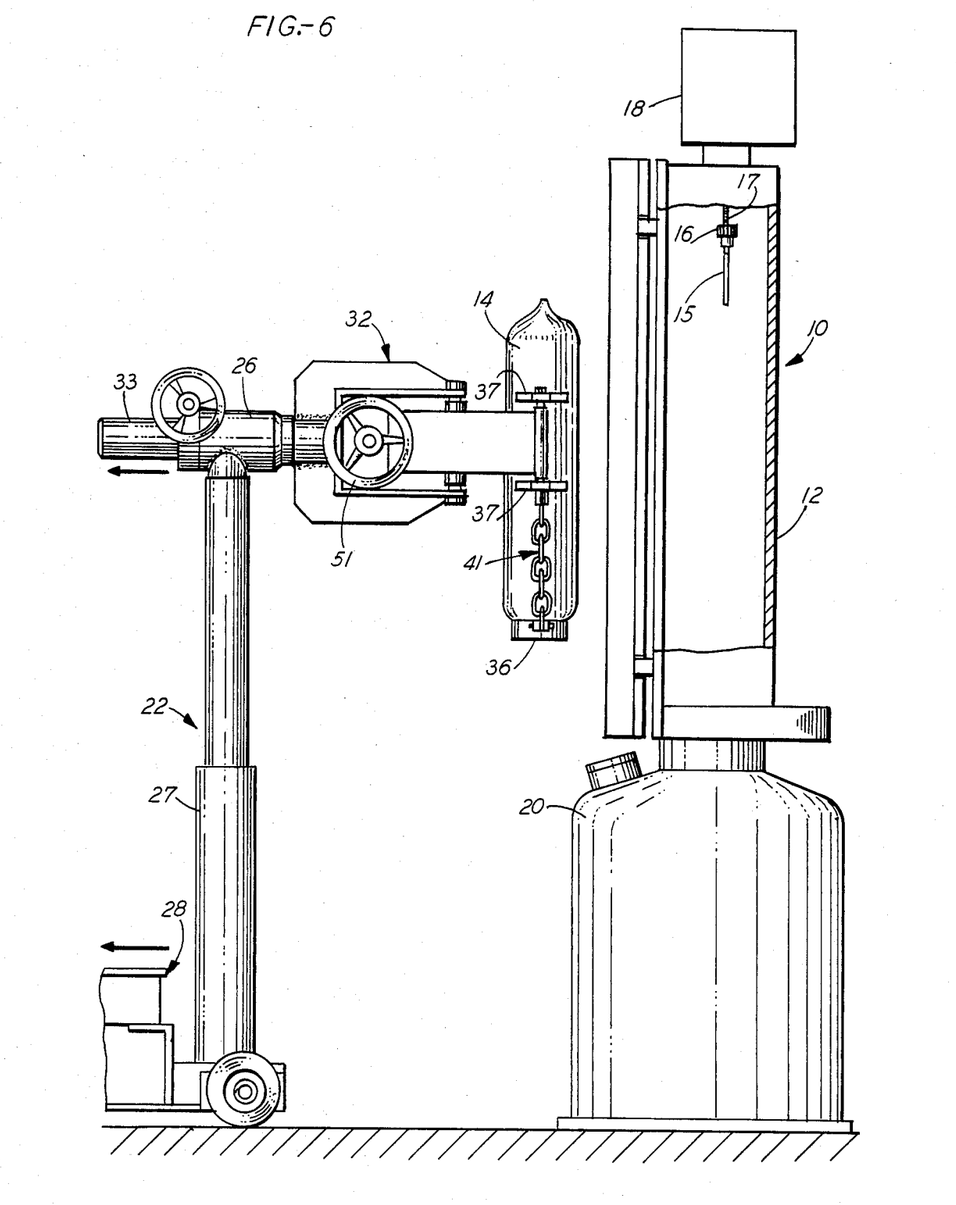
FIG. 6 shows the crystal ingot fully supported by the ingot handling apparatus of FIG. 1 and the handling apparatus in a position retracted from the furnace.

In FIG. 2 the base support 36 of the gripper-support assembly 32 is positioned just below the base 38 of the ingot 14. The gripper jaws 37 are closed to a position at which the jaws 37 are capable of guiding the ingot 14 but do not engage it while the ingot 14 remains in its vertical position. Depending on the length of the ingot 14, the lengths of suspenders as, for example, chains 41 (shown in the embodiment of FIG. 1) which suspend the base support 36 below the gripper jaws 37 are preferably preadjusted to a distance which positions the gripper jaws 37 at or above the center of gravity of the ingot 14 when the base support 36 is in contact with the base 38 of the ingot 14, as is shown in FIGS. 1 and 6.

Referring again to FIG. 2, the dimension "D" indicates such a preferred distance between the base support 36 and a horizontal plane identified by line 42 wherein lateral forces exerted by the jaws 37 are centered. FIG. 2 shows a single pair of opposed jaws 37 and the central plane 42 of resultant lateral forces horizontally centered on such jaws 37. It should be understood that a similar central plane 42 through which the resultant lateral forces of two vertically spaced pairs of jaws 37 act lies substantially centered between the two vertically spaced pairs of jaws. As indicated in FIG. 2 by arrows 39, relative vertical movement between the crystal ingot 14 and the gripper-support assembly positions the base 38 of the ingot 14 in firm contact with the base support 36. Such relative movement is continued until substantially the entire weight of the crystal ingot 14 is supported by the base support 36.

Figure 3:
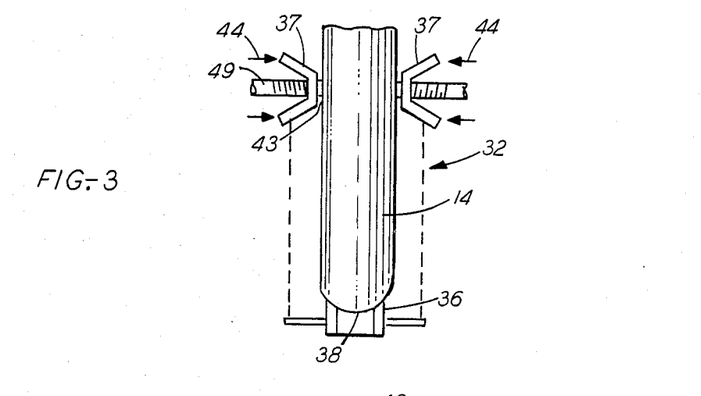

FIG. 3 shows the ingot 14 resting with its base 38 firmly on the base support 36. It should be kept in mind that the termination of the growing process does not always yield an ideally formed convex shape of the base 38 of the ingot 14. Some ingots may terminate in elongated, tapered bases 38, others may be almost flat or even slightly concave. The degree of nesting contact of the various shaped bases 38 with the base support 36, consequently, may vary depending on the shape of the particular base 38. An annular, cup-shaped structure of a preferred embodiment of the base support 36 has been found to support the various shapes of the ingot bases 38 firmly, even when the ingot 14 engages the base support 36 only in a few contact areas. Thus in all instances the base 38 is supported firmly by the base support 36.

Figure 4:
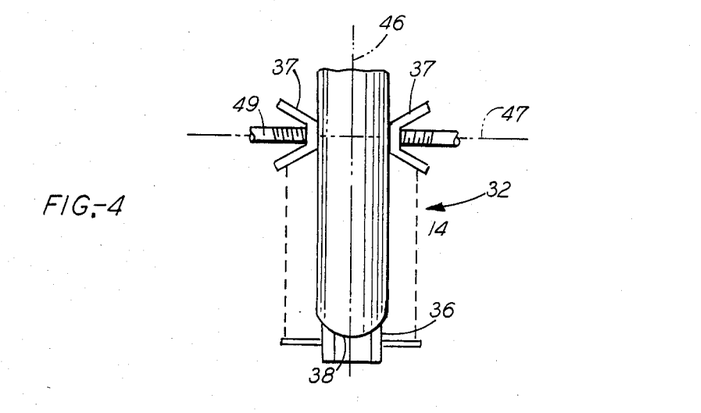

The gripper jaws 37, the vertical positions of which are now established with respect to the ingot 14, are moved inward toward each other to close firmly against the cylindrical surface 43 of the ingot 14 as indicated by arrows 44. FIG. 4 shows schematically the ingot 14 as being fully engaged by the gripper-support assembly 32 after the jaws have closed into firm contact with the ingot 14. The base support 36 supports vertical forces of the ingot 14 acting through a vertical centerline 46 while the opposed jaws 37 steady the ingot in a horizontal plane represented by the horizontal centerline 47. Once the gripper-support assembly 32 fully engages the ingot 14 in the described manner, the gripper-support assembly 32 and the ingot 14 function as a unit. Thus, the cantilever beam 33 may now be rotated about its axis to change the orientation of the ingot without the ingot becoming released. It should be realized, however, that as a result of such reorientation the reference frame of vertical and horizontal forces becomes also reoriented. In addition, if the ingot 14 is rotated away from the vertical, the gripper jaws 37 support, in addition to the lateral forces, at least some of the vertical forces which exist as a result of established tension in the suspenders of the base support and those forces which counteract any torque on the gripper-support assembly 32.

Figure 5:
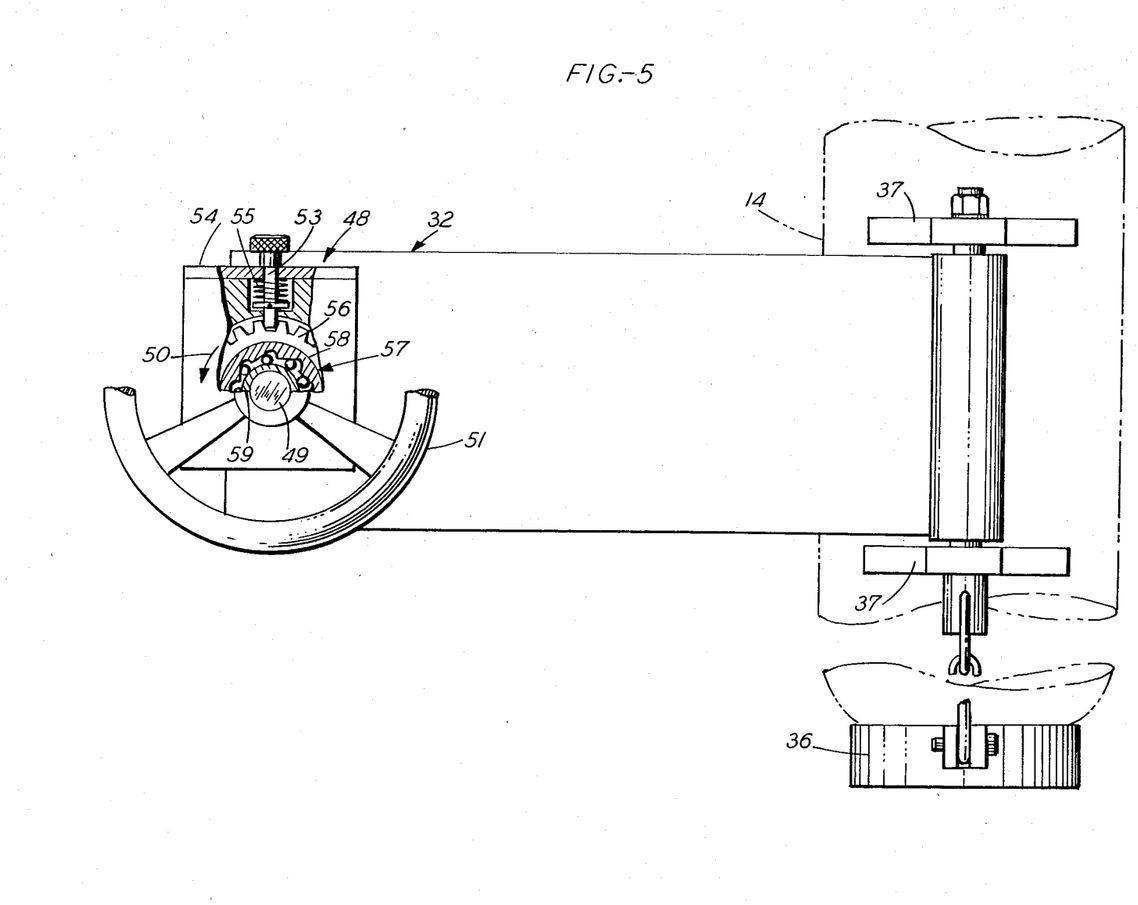
FIG. 5 shows a detent mechanism of the ingot handling apparatus of FIG. 1.

A detent assembly 48 referenced in FIG. 1 adds a safety blocking feature to the jaws 37. Referring now to FIG. 5, there are shown details of a typical detent assembly 48 which prevents the jaws 37 from opening accidentally to release the ingot 14 once they are closed into engagement with the ingot. The detent assembly 48 blocks a shaft 49 from rotating in a designated direction, such as indicated, for example, by an arrow 50. The rotation of the shaft 49, such as by a turned handwheel 51, moves the opposed jaws 37 of each of the vertically arranged pairs of jaws 37 toward and away from each other, as, for example, by oppositely pitched helical driving grooves 52 which are shown in FIG. 2, for example. Referring back to FIG. 5 a blocking force to stop the shaft 49 from rotating in the direction of the arrow 50 is generated by a detent pin 53. The pin 53 is mounted in a frame member 54 of the gripper-support assembly 32 and is biased by a spring 55 into engagement with a detent wheel 56. A one-way clutch 57 having an outer member referred to as outer race 58 mounted to the detent wheel 56 and a mating inner race 59 mounted to the shaft 49 stops the rotation of the shaft 49 in the desired direction to prevent an accidental disengagement of the gripper jaws 37 from the ingot 14.

When the detent pin 53 is lifted, both the shaft and the detent wheel 56 are able to rotate in the locking direction of the one-way clutch 57, since such simultaneous rotation can be accomplished without relative movement of the inner and outer races. However, while the detent pin 53 remains in engagement with the wheel 56, and the gripper-support assembly fully engages the ingot 14, the combination of the base support 36 and the jaws 37 provide a secure hold on the ingot 14 such that the ingot 14 may now be moved about.

In FIG. 6 the handling apparatus 22 is shown in a position away from the furnace 10. The prior hold by the support cable 17 of the pulling mechanism 18 has been severed, such as by breaking the seed 15. The ingot 14 held by the handling apparatus may now be transferred to a suitable storage stand to await further processing. It should be noted that the process of removing the ingot 14 from the furnace 10 no longer requires an operator to physically lift, move, or even come into contact with the ingot 14 which is typically removed at temperatures of 300° C. and higher. The described apparatus and process allow grown crystals to be removed from furnaces while still at such elevated temperatures, which were found to be prohibitively high for the removal of ingots by previously used manual removal methods, thereby allowing quicker restart of another crystal growing cycle.

Alternate Embodiments

Within the spirit and scope of the described invention various alternate embodiments and changes or modifications are possible. For example, FIGS. 1 and 6 depict the gripper jaws 37 as two adjacent, vertically spaced pairs of jaws 37. Such two spaced pairs of jaws are functionally similar to a single pair of jaws and have been found to hold the ingot more securely than a single pair of jaws. Consequently, the two spaced pairs of the jaws 37 steady the ingot 14 with only a small lateral stabilizing force on the crystal to minimize the risk of possibly damaging the ingot by excessive localized stresses. The spaced, dual jaws 37 shown in FIGS. 1 and 6 offer a substantially unstressed hold on the ingot 14 even if the ingot did not grow as a perfectly straight cylinder. While two spaced pairs of jaws 37 are preferably used in the gripper-support assembly 32, the use of a single pair of jaws 37, as shown in the schematic representations of FIGS. 2 through 4 or, of course, a multiplicity of jaws, is nevertheless an acceptable alternate embodiment of the invention.

However, a third laterally gripping contact on the ingot 14 is likely to introduce a damaging bending stress. The first two laterally gripping pairs of jaws 37 tend to rotate the ingot to thereby determine its orientation with respect to the vertical. The two vertically spaced jaws are likely to introduce some deviation from the vertical into the longitudinal axis of a nonperfectly grown ingot 14. When a third pair or any further pair of jaws engages the ingot 14 with laterally opposed forces, such forces need to be mutually balanced to prevent a bending stress on the ingot. A cup-shaped base support 36, for example, which funnels the base 38 of the ingot 14 into a firm hold will tend to impose on the ingot lateral force components in addition to the force component opposing and supporting the weight of the ingot. In FIG. 1, the chains 41 suspending the base support 36 below the gripper jaws 37 allow the base support 36 to yield to any imbalance of horizontal forces and to shift its position in the horizontal plane without significantly changing its vertical position with respect to the jaws.

Figure 7:
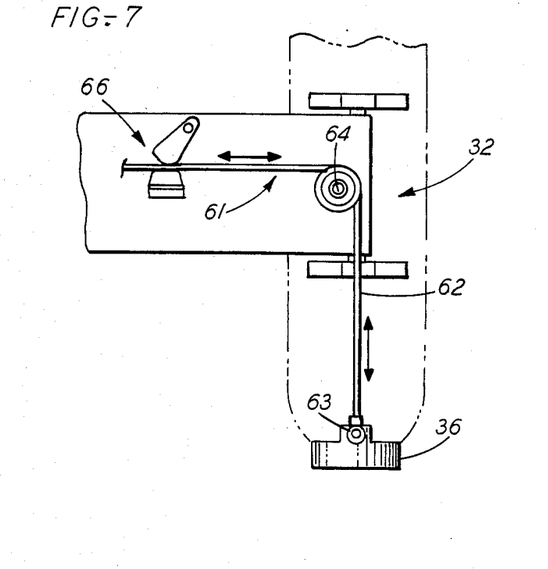
FIG. 7 shows an alternate embodiment of the crystal handling apparatus of FIG. 3, such alternate embodiment featuring a particular, vertically adjustable suspension of an ingot support of the handling apparatus.

Referring now to FIG. 7, a cable suspension 61 of the base support 36, shown as an alternate embodiment of certain features of the invention, similarly allows the base support 36 to shift in a horizontal plane perpendicular to the direction in which suspending cables 62 extend. FIG. 7 further shows a preferred routing of such suspending cables 62. At a lower end the cables 62 are firmly fastened to mounting lugs 63 on opposite sides of the base support 36. The cables are then routed over vertical suspension lugs 64 mounted to the sides of the gripper-support assembly 32 and from there to a holding and adjusting mechanism, such as clamping dogs 66, given as an example.

Various modifications are, of course, possible with respect to the depicted cable suspension 61. For example, the clamping dogs 66 may take the place of the mounting lugs 63 on the base support 36 or of the vertical suspension lugs 64, such that the cables 62 are suspended vertically without a change of direction in the routing. The clamping dogs 66 may also be replaced by a locking reeling provision for changing the vertical position of the base support 36 with respect to the jaws 37.

Figure 8:
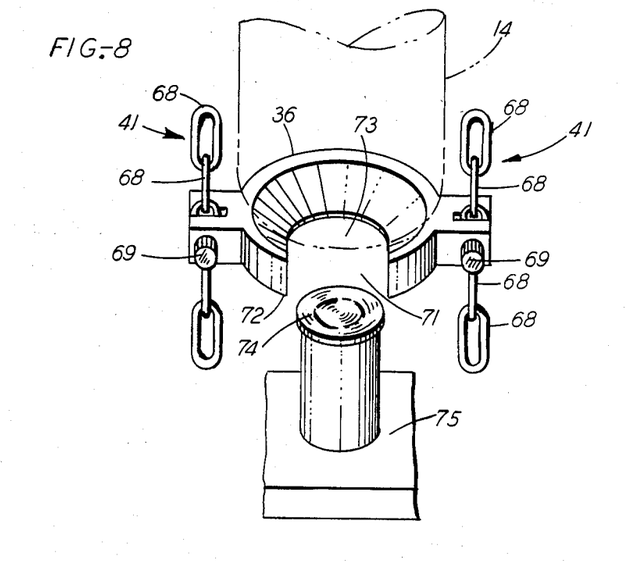
FIG. 8 shows a base support of the apparatus, depicting particularly advantageous transfer features of the base support of the gripper-support assembly as particular features of the invention.

The cable suspension 61 as shown in FIG. 7, differs from the chain suspension of FIG. 1 in that the cables 62 can be adjusted to any length within a given range, rather than by increments determined by the size of links 68 in the chain 41, as shown in FIG. 8, for example. FIG. 8 shows a length of several links 68 of the chains 41 hanging loosely below the base support 36. Thus, the base support can be adjusted upward or downward from its currently shown position by removing a quick-release pin 69 from each side of the base support 36 and then replacing the pins 69 through different ones of the links 68 which are respectively higher or lower on the chains 41.

FIG. 8 further shows an alternate embodiment of the apparatus 22 of FIG. 1. The base support 36 in FIG. 8 shows a slot 71 which extends from the front 72 of the base support 36 into a circular cutout about the center 73 of the support. When the ingot 14 is removed from the furnace and is transferred to a support pedestal 74 of a holding rack 75, the slot 71 allows the gripper-support assembly 32 to be readily withdrawn horizontally from the holding rack. The pedestal 74 passes through the slot 71 as the gripper-support assembly pulls away from the unloaded ingot 14 resting on the pedestal 74. As a possible alternate method of handling the ingot 14, the cantilever beam 33 may be rotated 90 degrees to turn the ingot 14 into a horizontal position to release it to a track or table like a log.

Figure 9:
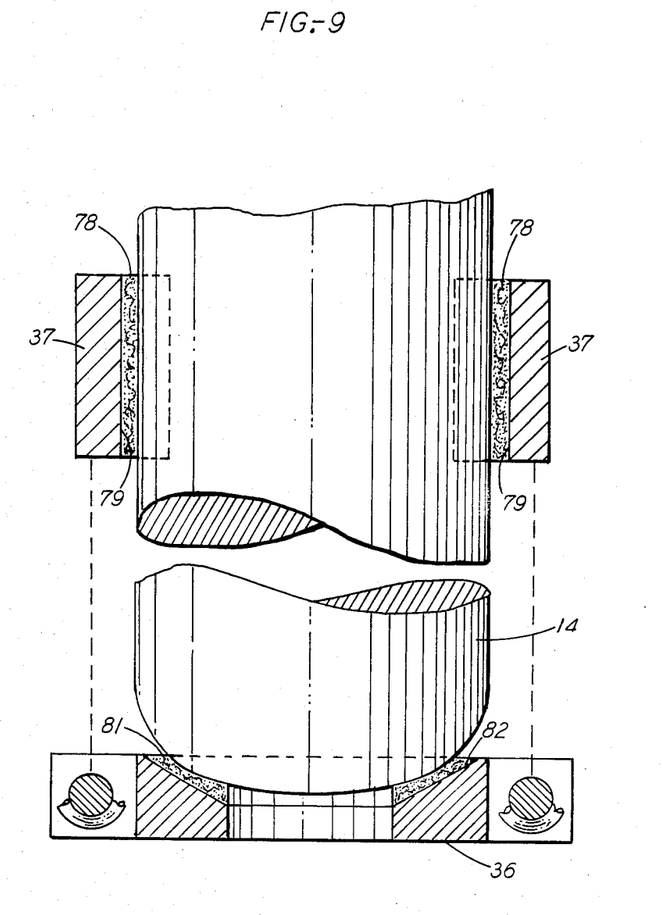
FIG. 9 is a schematic, sectional view of an alternate embodiment of the gripper-support assembly of the ingot handling apparatus, showing a particular stress-relieving padding which is interposed between such assembly and an ingot.

FIG. 9 shows an inert, heat resistant padding 78 which has been added to inner surfaces 79 of the gripper jaws 37, and a similar padding 81 which has been added to an inner upward directed surface 82 of the base support 36. The paddings 78 and 81 are preferably of a commercially available woven cloth of silicon. Such material is in essence the same as that of the grown ingots 14 and as such is not capable of contaminating the grown silicon crystal ingots. It should be realized, however, that a different, non-contaminating material such as graphite may be used as a padding material. Adding the paddings 78 and 81 to the surfaces which are otherwise in direct contact with the ingot 14 tends to reduce the friction coefficient between the ingot 14 and the elements of the modified gripper-support assembly 32. However, this is not regarded to be detrimental to the holding action of the gripper jaw assembly 32 inasmuch as all holding forces are applied substantially vertically to the respective, contacted surfaces. Consequently, any shearing forces which would be resisted by friction are essentially absent.

Thus, the padded structure of the gripper-support assembly 32 is no less efficient in supporting and steadying the ingots 14 than the unpadded assembly 32, as previously described. However, the paddings 78 and 81 have some advantage of protecting the ingot 14 from receiving fine surface scratches which may tend to result in stresses and defects along crystollographic planes of the ingot 14. In addition, a perhaps more significant advantage of the paddings 78 and 81 is that they introduce a thermal resistance between the gripper jaws 37 and the ingot 14 and between the base support 36 and the ingot 14. Such thermal resistance minimizes local cooling of the ingot 14 at points of contact with the gripper jaws and the base support. It appears that excessive local cooling contributes to the introduction of stresses into the ingot 14.

Removing the ingots from the furnaces 10 in the described manner without the added paddings 78 and 81 has not been found to result in stress defects in the ingots 14. However, the paddings 78 and 81 are believed to be advantageous in widening a safety margin to the onset of stress defects. From reading the above detailed description of the various alternate embodiments and modifications thereof, it should be realized that various other changes and modifications are possible within the spirit and scope of the invention.

What is claimed is:

1. Apparatus for handling a crystal ingot comprising:

at least one pair of opposed jaws movably mounted to an end of a cantilever beam so as to move with respect to each other in a first plane, said jaws having inward directed guiding surfaces for contacting opposite sides of a lateral surface of the crystal ingot upon being manipulated into position adjacent to such opposite sides of the lateral surface of the crystal ingot;

a base support positioned and arranged so as to contact a lower end of the crystal ingot in a direction substantially perpendicular to said first plane of movement of the at least one pair of jaws for supporting said crystal ingot in said substantially perpendicular direction;

means for locating said base support relative to and below the jaws, said locating means capable of supporting a substantially vertical force component of the crystal ingot; and means for manipulating said at least one pair of jaws into positions adjacent to and into contact with opposite sides of such lateral surface of the crystal ingot to firmly support a force component in a direction substantially orthogonal to the force component supported by the base support.

2. Apparatus for handling a crystal ingot according to claim 1, wherein said means for manipulating comprises a positioning head, said cantilever beam movably mounted in said positioning head and positioned and arranged so as to move with respect to said positioning head in a direction coextensive with a length of the cantilever beam, said cantilever beam supporting at said one end thereof said at least one pair of jaws to extensibly move said at least one pair of jaws toward and into position adjacent to opposite sides of the lateral surface of the crystal ingot, and means for moving the positioning head in a direction perpendicular to the direction of movement of said cantilever beam with respect to the positioning head.

3. Apparatus for handling a crystal ingot according to claim 2, wherein the means for locating the base support comprises means for suspending the base support from the at least one pair of jaws into a position substantially centered on a vertical axis through the center of the at least one pair of jaws, said suspending means being laterally flexible to permit the base support to shift laterally from such vertical axis without significantly changing the vertical distance between the base support and the at least one pair of jaws.

4. Apparatus for handling a crystal ingot according to claim 3, wherein the means for suspending the base support comprises a pair of laterally spaced link chains, each one of which being mounted to one of said jaws of said at least one pair of jaws, said base support being mounted to laterally opposite links of such chains at a predetermined distance below the at least one pair of jaws.

5. Apparatus for handling a crystal ingot according to claim 4, wherein said at least one pair of jaws comprises two vertically spaced pairs of jaws, and said laterally spaced link chains extend downward from the lowermost of said pairs of jaws.

6. Apparatus for handling a crystal ingot according to claim 4, wherein the predetermined distance at which the base support is mounted is determined by the length of the crystal ingot to be handled and the base support is mounted to predetermined, opposite links which position the base support in supportive contact with a base of the crystal ingot such that a center of support of said inwardly directed guiding surfaces of said at least one pair of jaws is positioned at a height from such base of the crystal ingot which is no less than the distance between the base and the center of gravity of the crystal ingot.

7. Apparatus for handling a crystal ingot according to claim 6, wherein said at least one pair of opposed jaws comprises two vertically spaced pairs of jaws such that said center of support of said inwardly directed guiding surfaces of said two vertically spaced pairs of jaws is located on an intersection between a second plane bisecting the space between said two vertically spaced pairs of jaws and said vertical axis through said pairs of jaws.

8. Apparatus for handling a crystal ingot according to claim 7, wherein said pair of laterally spaced link chains extends from the lowermost of said pairs of jaws.

9. Apparatus for handling a crystal ingot according to claim 3, wherein said means for suspending the base support comprises at least two flexible cables mounted to said at least one pair of jaws and to the base support to support the base support at a predetermined distance below the at least one pair of jaws.

10. Apparatus for handling a crystal ingot according to claim 9, wherein the predetermined distance is determined from the length of the crystal ingot to be handled such that a center of support of said inwardly directed guiding surfaces of said at least one pair of jaws is positioned at a height from a base of such crystal ingot when the base support is in supportive contact with such base, which height is no less than a distance from such base to the center of gravity of said crystal ingot to be handled, and said height is adjustable, said apparatus further including means for adjusting the lengths of said at least two cables to such predetermined distance.

11. Apparatus according to claim 10, comprising means for clamping the at least two cables, said clamping means being mounted to the assembly of said at least one pair of jaws and the base support suspended by said at least two cables to maintain said predetermined distance between said at least one pair of jaws and said base support.

12. Apparatus according to claim 3, wherein said means for manipulating comprises means for moving said opposed jaws of said at least one pair of jaws toward and away from each other, and means for blocking said jaw moving means from moving said opposed jaws away from each other, said blocking means being selectively disengageable to become inoperative to permit said at least one pair of jaws to become disengaged from contact with said opposite sides of the lateral surface of the crystal ingot after the crystal ingot has been handled by said apparatus.

13. Apparatus according to claim 12, wherein said blocking means comprises a rotatable shaft having oppositely pitched helical grooves, each of such grooves being coupled to one of said jaws to move such one coupled jaw opposite to such other coupled one of the at least one pair of jaws, a one-way clutch having inner and outer races, an inner race mounted to such rotatable shaft and a detent mounted for selective engagement with an outer race of such one-way clutch for selectively blocking, upon becoming engaged with said outer race, the rotation of the shaft in the direction to move said opposed jaws away from each other.

14. Apparatus for handling a crystal ingot according to claim 3, wherein the base support is cup-shaped to provide at least some lateral support for the crystal ingot, and further includes a slot extending from a side into a central cutout of the base support.

15. Apparatus for handling a crystal ingot according to claim 14, wherein said cantilever beam is rotatably mounted with respect to the positioning head to rotate about the longitudinal axis of the cantilever beam and allow the crystal ingot to be rotated into a horizontal position, whereby the at least one pair of jaws engages the lateral surface of the crystal ingot with a force component normal to such lateral surface resulting in friction to support the crystal ingot with at least such force in the longitudinal direction of the crystal ingot along such lateral surface of such ingot to maintain tension in the suspending means.

16. Apparatus for handling a crystal ingot according to claim 14, further comprising heat resistant paddings covering surfaces of the at least one pair of jaws adapted to contact the crystal ingot and heat resistant paddings covering surfaces of the base support adapted to contact the base of the crystal ingot.

17. A method of handling a crystal ingot grown in a crystal growing furnace having lateral access, comprising:

engaging and supporting the ingot hanging vertically disposed from a seed holder in a vertical chamber of the furnace by a support contacting the base of the ingot;

thereafter, engaging at least one pair of inwardly acting, opposed jaws with opposite sides of the lateral surface of the ingot to support lateral forces acting on the ingot; and manipulating the support and the at least one pair of jaws in unison in a retracting lateral motion to remove the supported and laterally engaged ingot from said crystal growing furnace.

18. A method of handling a crystal ingot according to claim 17, comprising:

adjusting a vertical relationship between the support and the at least one pair of jaws to the length of the ingot to position a longitudinal center position of the lateral engagement of the at least one pair of jaws along the lateral surface of the ingot at a distance from the ingot supporting support which is at least equal to the distance from the base of the ingot to its center of gravity.

19. A method of handling a crystal ingot according to claim 17, wherein supporting the ingot comprises:

suspending said support by laterally flexible suspenders from said at least one pair of jaws;

moving said at least one pair of jaws and said suspended support simultaneously in a lateral direction to position said support adjacent to and below the base of the crystal ingot;

closing said at least one pair of jaws toward each other into a position immediately adjacent to and lacking firm contact with opposite sides of the lateral surface of the crystal ingot; and moving the crystal ingot and the at least one pair of jaws with the suspended support relative to each other in a vertical direction thereby transferring the weight of the ingot from the seed holder to the support.

20. A method of handling a crystal ingot according to claim 17, further comprising prior to supporting the ingot, adjusting the vertical relationship between the at least one pair of jaws and the support, such that the center of contact of said inwardly acting, opposed jaws of said at least one pair of jaws positions itself along the vertical between the center of gravity and an upper end of the crystal ingot when the weight of the crystal ingot is transferred to the support.

21. A method of handling a crystal ingot according to claim 20, further comprising transferring the crystal ingot to a pedestal by lowering the support about the pedestal, and laterally retracting the support from the pedestal whereby the pedestal retracts relative to the support through a slot provided in the support.

* * * * *